United States Patent
Liu et al.

(10) Patent No.: US 11,573,454 B2
(45) Date of Patent: Feb. 7, 2023

(54) DISPLAY APPARATUS

(71) Applicant: Coretronic Corporation, Hsin-Chu (TW)

(72) Inventors: Yu-Yu Liu, Hsin-Chu (TW); Tao-Lin Wang, Hsin-Chu (TW); Wen-Pin Yang, Hsin-Chu (TW); Chen-Hung Lin, Hsin-Chu (TW); Chung-Cheng Lin, Hsin-Chu (TW); Guan-Jr Huang, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 0 days.

(21) Appl. No.: 17/845,951

(22) Filed: Jun. 21, 2022

(65) Prior Publication Data

US 2022/0413340 A1 Dec. 29, 2022

(30) Foreign Application Priority Data

Jun. 23, 2021 (CN) .......................... 202121397420.X

(51) Int. Cl.
*G02F 1/13357* (2006.01)
*H01L 33/62* (2010.01)
*G02F 1/1335* (2006.01)
*H01L 33/50* (2010.01)
*G02F 1/1339* (2006.01)

(52) U.S. Cl.
CPC ...... *G02F 1/133603* (2013.01); *G02F 1/1339* (2013.01); *G02F 1/133512* (2013.01); *G02F 1/133608* (2013.01); *H01L 33/505* (2013.01); *H01L 33/62* (2013.01)

(58) Field of Classification Search
CPC ........ G02F 1/133603; G02F 1/133608; G02F 1/133512; G02F 1/1339; H01L 33/505; H01L 33/62

See application file for complete search history.

(56) References Cited

U.S. PATENT DOCUMENTS

2021/0273025 A1* 9/2021 Aoyama ............. H01L 51/5284

FOREIGN PATENT DOCUMENTS

TW      201211642      3/2012
TW      202035617      10/2020

* cited by examiner

*Primary Examiner* — Anne M Hines
*Assistant Examiner* — Jose M Diaz
(74) *Attorney, Agent, or Firm* — JCIPRNET

(57) ABSTRACT

A display apparatus including a circuit board, a plurality of light-emitting devices and a display panel is provided. The light-emitting devices are disposed on the circuit board and electrically connected to the circuit board. The display panel is disposed on the light-emitting devices. The display panel includes a peripheral light-shielding pattern. An opening portion of the peripheral light-shielding pattern defines an active area of the display panel. A physical portion of the peripheral light-shielding pattern defines a non-active area of the display panel. An optical axis of a light-emitting surface of at least one of the light-emitting devices is located at a junction of the active area and the non-active area, at the non-active area, or at the active area and a side wall of the at least one of the light-emitting devices is located at the junction of the active area and the non-active area.

12 Claims, 5 Drawing Sheets

DISPLAY APPARATUS

CROSS-REFERENCE TO RELATED APPLICATION

This application claims the priority benefit of China application serial no. 202121397420.X, filed on Jun. 23, 2021. The entirety of the above-mentioned patent application is hereby incorporated by reference herein and made a part of this specification.

BACKGROUND

Technical Field

The invention relates to a photoelectric apparatus, and particularly relates to a display apparatus.

Description of Related Art

Compared with conventional light-emitting diodes (LEDs), mini-LEDs are smaller in size, but in terms of application in display apparatuses (such as TV sets), the mini-LEDs have not yet reached a degree for being directly used as pixel points. However, the mini-LEDs may be used in a backlight module to realize a type of improved backlight module. For example, the mini-LEDs may be used in collaboration with a flexible substrate to realize a backlight module with a curved surface; the mini-LED may be used in collaboration with image characteristics of a display panel and adopt a local dimming design to allow the display apparatus to have better color rendering as well as a power-saving function.

Generally, in order to realize an ultra-thin display apparatus, multiple mini-LEDs are often used as a light source of a backlight module. The backlight module using the mini-LEDs further includes a color conversion film to convert blue light emitted by the mini-LEDs into red light and green light, so as to produce white light by mixing the red, green and blue light. However, there is an ineffective region at an edge of the color conversion film, and the blue light emitted by the mini-LEDs cannot be effectively converted into red and green light at the edge of the display apparatus, thereby causing a blue halo phenomenon at the edge of the display apparatus.

SUMMARY

The invention is directed to a display apparatus having good display quality.

An embodiment of the invention provides a display apparatus including a circuit board, a plurality of light-emitting devices and a display panel. The light-emitting devices are disposed on the circuit board and electrically connected to the circuit board. The display panel is disposed on the light-emitting devices. The display panel includes a peripheral light-shielding pattern. An opening portion of the peripheral light-shielding pattern defines an active area of the display panel. A physical portion of the peripheral light-shielding pattern defines a non-active area of the display panel. An optical axis of a light-emitting surface of at least one of the light-emitting devices is located at a junction of the active area and the non-active area, the optical axis of the light-emitting surface of the at least one of the light-emitting devices is located at the non-active area, or the optical axis of the light-emitting surface of the at least one of the light-emitting devices is located at the active area and a side wall of the at least one of the light-emitting devices is located at the junction of the active area and the non-active area.

In an embodiment of the invention, an inner edge of the physical portion of the peripheral light-shielding pattern defines the opening portion, and the optical axis of the light-emitting surface of at least one of the plurality of light-emitting devices is substantially aligned with the inner edge of the physical portion of the peripheral light-shielding pattern.

In an embodiment of the invention, the optical axis of the light-emitting surface of at least one of the plurality of light-emitting devices is overlapped with the physical portion of the peripheral light-shielding pattern.

In an embodiment of the invention, the display apparatus further includes a first diffusion device and a glue. The first diffusion device is disposed on the plurality of light-emitting devices. The glue is disposed between the first diffusion device and the circuit board. The glue is overlapped with the physical portion of the peripheral light-shielding pattern and is misaligned with the opening portion of the peripheral light-shielding pattern. The first diffusion device is fixed on the circuit board through the glue.

In an embodiment of the invention, the display apparatus further includes a sealant layer, which is disposed on the circuit board and covers the plurality of light-emitting devices. The sealant layer is disposed between the first diffusion device and the circuit board. The glue is disposed on the sealant layer and disposed between the first diffusion device and the sealant layer.

In an embodiment of the invention, the display apparatus further includes a plastic frame. The first diffusion device is disposed in the plastic frame. The circuit board has a protruding portion extending beyond the first diffusion device. The plastic frame is disposed on the protruding portion and fixed on the circuit board through the glue.

In an embodiment of the invention, at least a part of the at least one of the light-emitting devices is overlapped with the physical portion of the peripheral light-shielding pattern and is misaligned with the glue.

In an embodiment of the invention, at least one of the plurality of light-emitting devices is overlapped with the physical portion of the peripheral light-shielding pattern and the glue.

In an embodiment of the invention, an inner edge of the glue is overlapped with the inside of the first diffusion device.

In an embodiment of the invention, the display apparatus further includes a color conversion film, which is disposed on the first diffusion device. The first diffusion device is disposed between the color conversion film and the circuit board, and an inner edge of the glue is overlapped with the inside of the color conversion film.

In an embodiment of the invention, the display apparatus further includes a second diffusion device disposed on the color conversion film. The color conversion film is disposed between the first diffusion device and the second diffusion device. An inner edge of the glue is overlapped with the inside of the second diffusion device.

In an embodiment of the invention, the display apparatus further includes at least one optical film disposed on the second diffusion device. The at least one optical film is disposed between the display panel and the second diffusion device, and an inner edge of the glue is overlapped with the inside of the at least one optical film.

Based on the above description, the optical axis of the light-emitting surface of the at least one light-emitting device is located at a junction of the active area and the non-active area, at the non-active area, or at the active area and a side wall of the at least one of the light-emitting devices is located at the junction of the active area and the non-active area. Therefore, an illumination light beam emitted by the at least one light-emitting device may be transmitted to the color conversion film disposed near the junction of the active area and the non-active area, thereby providing the white light required by the display panel near the junction of the active area and the non-active area, so as to mitigate the blue halo phenomenon on the edge of the display apparatus.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
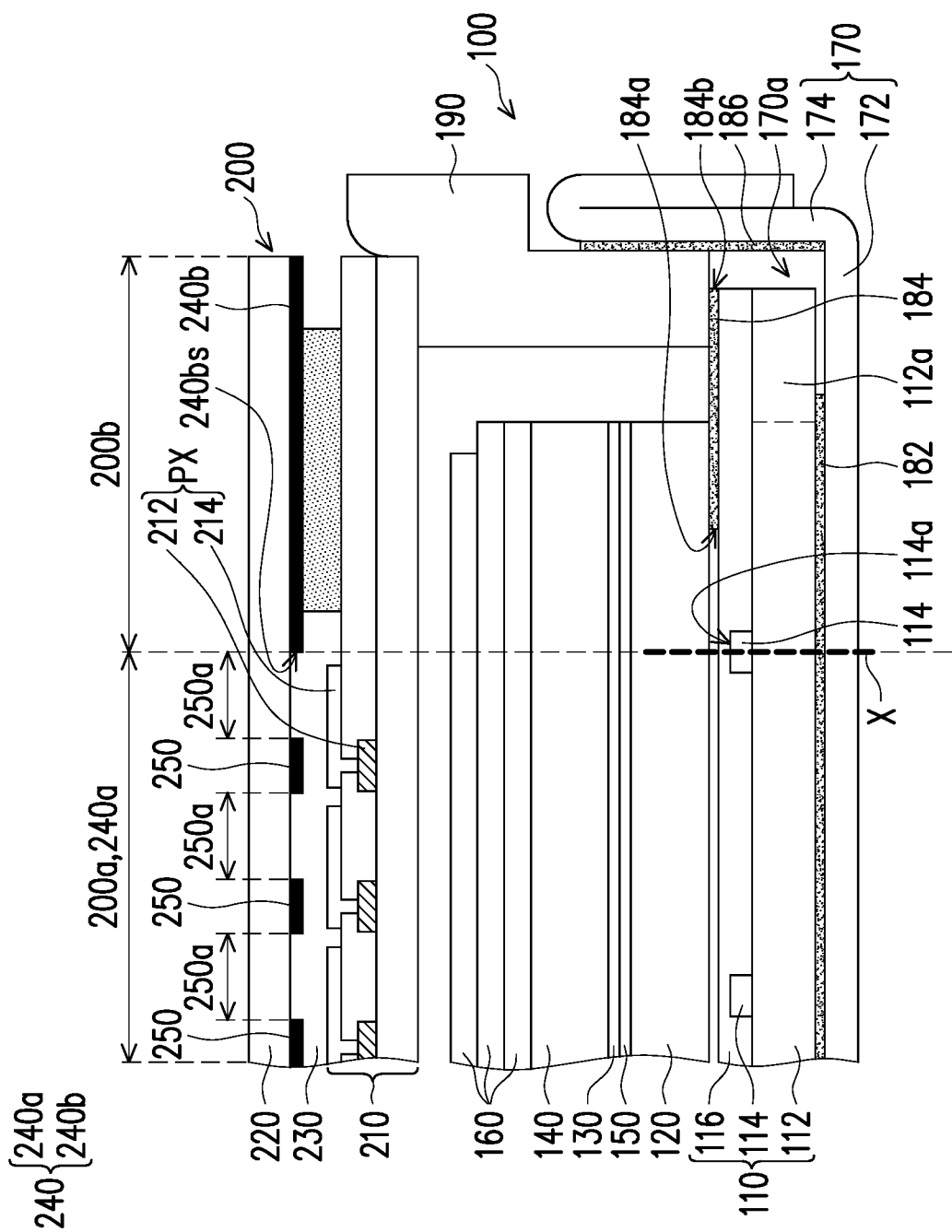
FIG. 1 is a schematic cross-sectional view of a display apparatus 10 according to an embodiment of the invention.

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "left," "right," "front," "back," etc., is used with reference to the orientation of the Figure(s) being described and are not intended to be limiting of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic cross-sectional view of a display apparatus 10 according to an embodiment of the invention. Referring to FIG. 1, the display apparatus 10 includes a backlight module 100. The backlight module 100 includes a light board 110. The light board 110 includes a circuit board 112 and a plurality of light-emitting devices 114, wherein the plurality of light-emitting devices 114 are disposed on the circuit board 112 and are electrically connected to the circuit board 112. In the embodiment, the light board 110 may further optionally include a sealant layer 116, which is disposed on the circuit board 112 and covers the plurality of light-emitting devices 114. For example, in the embodiment, the plurality of light-emitting devices 114 may be a plurality of mini-LEDs, and the sealant layer 116 may be transparent protective sealant covering the plurality of mini-LEDs, but the invention is not limited thereto.

In the embodiment, the backlight module 100 further includes a back plate 170, wherein the light board 110 is disposed in an accommodating space 170a enclosed by a bottom plate 172 and a side wall 174 of the back plate 170. In the embodiment, the backlight module 100 may further optionally include a first adhesive layer 182, where the first adhesive layer 182 is disposed between the light board 110 and the bottom plate 172, so as to fix the light board 110 on the bottom plate 172.

In the embodiment, the backlight module 100 further includes a first diffusion device 120 disposed on the plurality of light-emitting devices 114. In the embodiment, the sealant layer 116 of the light board 110 is disposed between the first diffusion device 120 and the circuit board 112.

In the embodiment, the backlight module 100 further includes a color conversion film 130 disposed on the first diffusion device 120, wherein the first diffusion device 120 is disposed between the color conversion film 130 and the circuit board 112. The color conversion film 130 is suitable for performing color conversion and adjustment on an illumination light beam (not shown) emitted by the light-emitting device 114. For example, in the embodiment, when the illumination light beam emitted by the light-emitting device 114 is blue light, a portion of the illumination light beam is converted into red light and green light by passing through the color conversion film 130, and the red light and the green light are mixed with the other portion of the blue light to form white light. In the embodiment, a material of the color conversion film 130 may include quantum dots (QD), KSF+β-Sialon, YAG, etc., but the invention is not limited thereto.

In the embodiment, the backlight module 100 further includes a second diffusion device 140 disposed on the color conversion film 130, wherein the color conversion film 130 is disposed between the first diffusion device 120 and the second diffusion device 140.

In the embodiment, the backlight module 100 may further optionally include an optical device 150 disposed between the color conversion film 130 and the first diffusion device 120. For example, in the embodiment, the optical device 150 may be a blue light enhancement film. However, the invention is not limited thereto. In other embodiments, the optical device 150 may also be other types of optical devices, such as but not limited to: a light-transmitting plate with multiple printing dots.

In the embodiment, the backlight module 100 further includes an optical film 160 disposed on the second diffusion device 140, wherein the optical film 160 is disposed between a display panel 200 and the second diffusion device 140, and the quantity of the optical film 160 may be one or plural. For example, in the embodiment, the optical film 160 may include a diffusion sheet, a brightness enhancement sheet, or a combination thereof. However, the invention is not limited thereto. The quantity and type of the optical films 160 may be changed according to an optical effect to be achieved by the backlight module 100, and is not limited by the invention.

The display apparatus 10 further includes the display panel 200 disposed on the plurality of light-emitting devices 114 of the backlight module 100. For example, in the embodiment, the display panel 200 may include a pixel array substrate 210, a counter substrate 220, and a non-self-luminous display medium 230. The pixel array substrate 210 and the counter substrate 220 are disposed opposite to each other, and the non-self-luminous display medium 230 is disposed between the pixel array substrate 210 and the counter substrate 220. In the embodiment, the non-selfluminous display medium 230 is, for example, liquid crystal, but the invention is not limited thereto.

The display panel 200 further includes a peripheral light-shielding pattern 240. The peripheral light-shielding pattern 240 includes an opening portion 240a and a physical portion 240b. In one embodiment, the physical portion 240b is a frame-shaped structure, and an area surrounded by an inner edge 240bs of the frame-shaped structure is defined as the opening portion 240a. In other words, a boundary of the opening portion 240a includes the inner edge 240bs of the physical portion 240b. The opening portion 240a of the peripheral light-shielding pattern 240 defines a active area 200a of the display panel 200. The active area 200a of the display panel 200 refers to a valid area of the display panel that may be controlled to display images. The physical portion 240b of the peripheral light-shielding pattern 240 defines a non-active area 200b of the display panel 200. The non-active area 200b of the display panel 200 refers to an area outside the valid area of the display panel that may be controlled to display images, for example, a black matrix area surrounding the valid area adapted to display images. Then inner edge 240bs of the physical portion 240b of the peripheral light-shielding pattern 240 is a junction of the active area 200a and the non-active area 200b of the display panel 200.

In the embodiment, the pixel array substrate 210 has a plurality of pixel structures PX disposed in the active area 200a, wherein each pixel structure PX may include an active device 212 and a pixel electrode 214 electrically connected to the active device 212. The display panel 200 further includes a plurality of first light-shielding patterns 250 and a plurality of second light-shielding patterns (not shown), wherein a plurality of vertical projections of the plurality of first light-shielding patterns 250 on the counter substrate 220 and a plurality of vertical projections of the plurality of second light-shielding patterns (not shown) on the counter substrate 220 are staggered into a mesh to define a plurality of pixel openings 250a. The pixel electrode 214 of each pixel structure PX is overlapped with a corresponding pixel opening 250a. The peripheral light-shielding pattern 240 refers to a light-shielding device disposed at the periphery of the plurality of first light-shielding patterns 250, the plurality of second light-shielding patterns (not shown), and the plurality of pixel openings 250a defined by the first and second light-shielding patterns, and the non-active area 200b of the display panel 200 is the area where the light-shielding device is disposed.

It should be noted that an optical axis X of a light-emitting surface 114a of at least one light-emitting device 114 is located at a junction of the active area 200a and the non-active area 200b (i.e., the inner edge 240bs of the physical portion 240b of the peripheral light-shielding pattern 240) or at the non-active area 200b. Therefore, the illumination light beam emitted by the at least one light-emitting device 114 may be transmitted to the color conversion film 130 disposed near the junction of the active area 200a and the non-active area 200b, thereby providing the white light required by the display panel 200 near the junction of the active area 200a and the non-active area 200b, so as to mitigate a blue halo phenomenon on the edge of the display apparatus 10.

In the embodiment, the backlight module 100 further includes a glue 184 disposed between the first diffusion device 120 and the circuit board 112. The glue 184 is overlapped with the physical portion 240b of the peripheral light-shielding pattern 240 of the display panel 200 and is misaligned with the opening portion 240a of the peripheral light-shielding pattern 240. The first diffusion device 120 is fixed on the circuit board 112 through the glue 184. In other words, through the glue 184 disposed on an edge of the light board 110, the first diffusion device 120 and the color conversion film 130 disposed on the first diffusion device 120 may extend beyond the junction of the active area 200a and the non-active area 200b of the display panel 200 and extend to the underneath of non-active area 200b of the display panel 200. In the embodiment, the glue 184 may be disposed on the sealant layer 116 of the light board 110 and disposed between the first diffusion device 120 and the sealant layer 116 of the light board 110, but the invention is not limited thereto.

In the embodiment, the backlight module 100 may optionally include a plastic frame 190, wherein the display panel 200 may be mounted on the plastic frame 190 so as to be disposed above the plurality of light-emitting devices 114. The first diffusion device 120 is disposed in the plastic frame 190, the circuit board 112 has a protruding portion 112a that extends beyond the first diffusion device 120, and the plastic frame 190 is disposed on the protruding portion 112a of the circuit board 112 and is fixed to the circuit board 112 through the glue 184. In short, through the glue 184 disposed on the edge of the light board 110, the plastic frame 190 may be mounted and fixed on the edge of the light board 110, so that a frame width of the display apparatus 10 is further reduced.

In the embodiment, the backlight module 100 may further optionally include a second adhesive layer 186 disposed between the plastic frame 190 and a side wall 174 of the back plate 170. In the embodiment, the plastic frame 190 may be fixed on the side wall 174 of the back plate 170 through the second adhesive layer 186, but the invention is not limited thereto.

In the embodiment, the glue 184 has an inner edge 184a and an outer edge 184b opposite to each other. The outer edge 184b of the glue 184 is disposed between the inner edge 184a of the glue 184 and the side wall 174 of the back plate 170, and the inner edge 184a of the glue 184 may be overlapped with the inside of the first diffusion device 120, the inside of the color conversion film 130, the inside of the second diffusion device 140, the inside of at least one optical film 160, and the inside of the physical portion 240b of the peripheral light-shielding pattern 240.

In the embodiment, the optical axis X of the light-emitting surface 114a of the at least one light-emitting device 114 is substantially aligned with the inner edge 240bs of the physical portion 240b of the peripheral light-shielding pattern 240. In the embodiment, at least a part of the at least one light-emitting device 114 may be overlapped with the physical portion 240b of the peripheral light-shielding pattern 240 and is misaligned with the glue 184. In brief, in the embodiment, at least one light-emitting device 114 is disposed at the junction of the active area 200a and the non-active area 200b. However, the invention is not limited thereto. In other embodiments, the at least one light-emitting device 114 may also be disposed in the non-active area 200b, which will be illustrated in the following paragraphs with reference of other figures.

It should be noticed that reference numbers of the components and a part of contents of the aforementioned embodiment are also used in the following embodiment, where the same reference numbers denote the same or like components, and descriptions of the same technical contents are omitted. The aforementioned embodiment may be referred for descriptions of the omitted parts, and detailed descriptions thereof are not repeated in the following embodiment.

Figure 2:
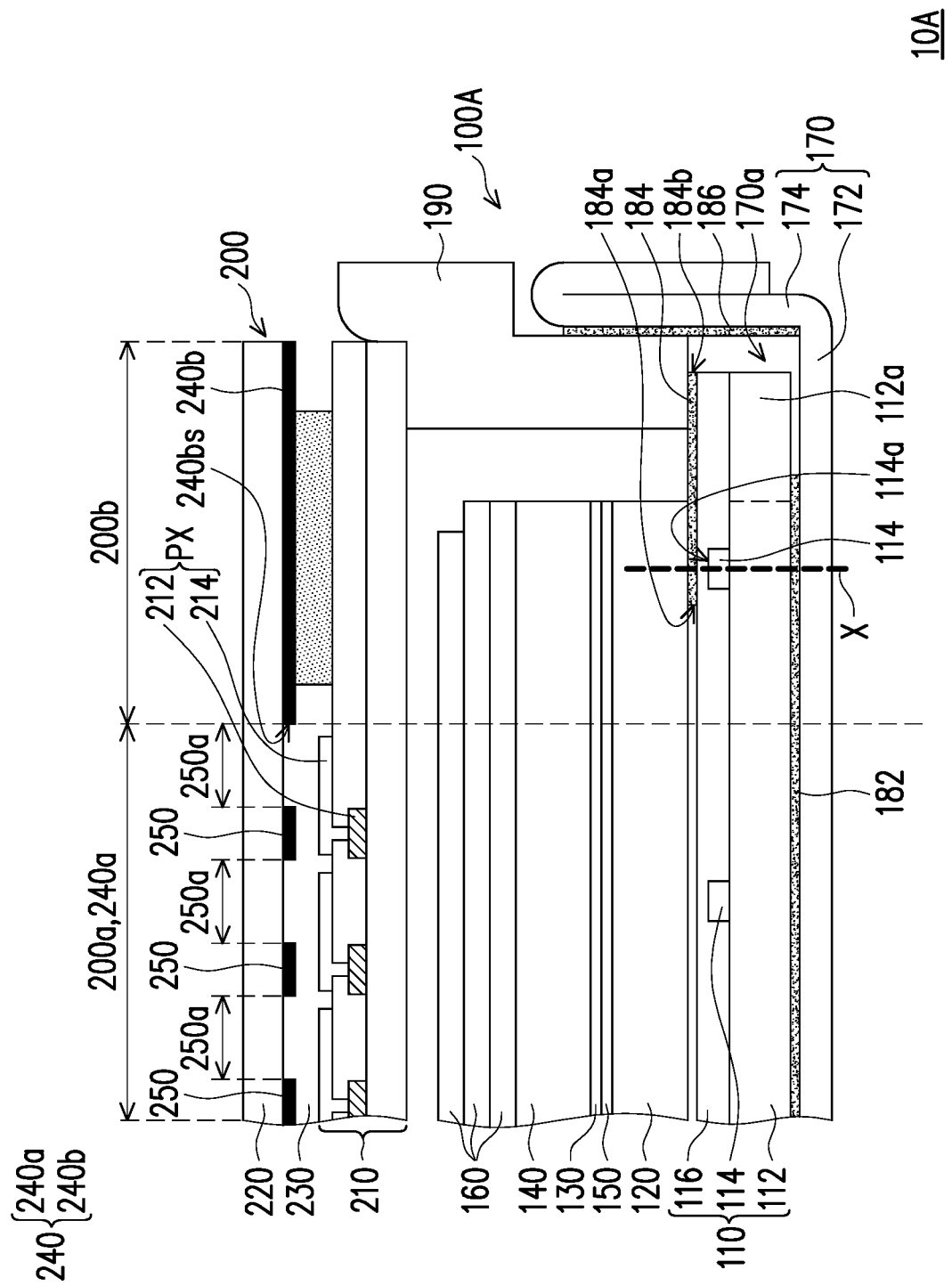
FIG. 2 is a schematic cross-sectional view of a display apparatus 10A according to another embodiment of the invention.

FIG. 2 is a schematic cross-sectional view of a display apparatus 10A according to another embodiment of the invention. The display apparatus 10A and a backlight module 100A thereof in FIG. 2 are similar to the display apparatus 10 and the backlight module 100 of FIG. 1, and a difference there between is that a position of the at least one light-emitting device 114 of FIG. 2 is different from the position of the at least one light-emitting device 114 of FIG. 1.

Referring to FIG. 2, in detail, in the embodiment, the optical axis X of the light-emitting surface 114a of at least one light-emitting device 114 is overlapped with the physical portion 240b of the peripheral light-shielding pattern 240. In other words, in the embodiment, at least one light-emitting device 114 is disposed in the non-active area 200b. Further, in the embodiment, at least one light-emitting device 114 may be selectively overlapped with the physical portion 240b of the peripheral light-shielding pattern 240 and the glue 184, but the invention is not limited thereto.

Figure 3:
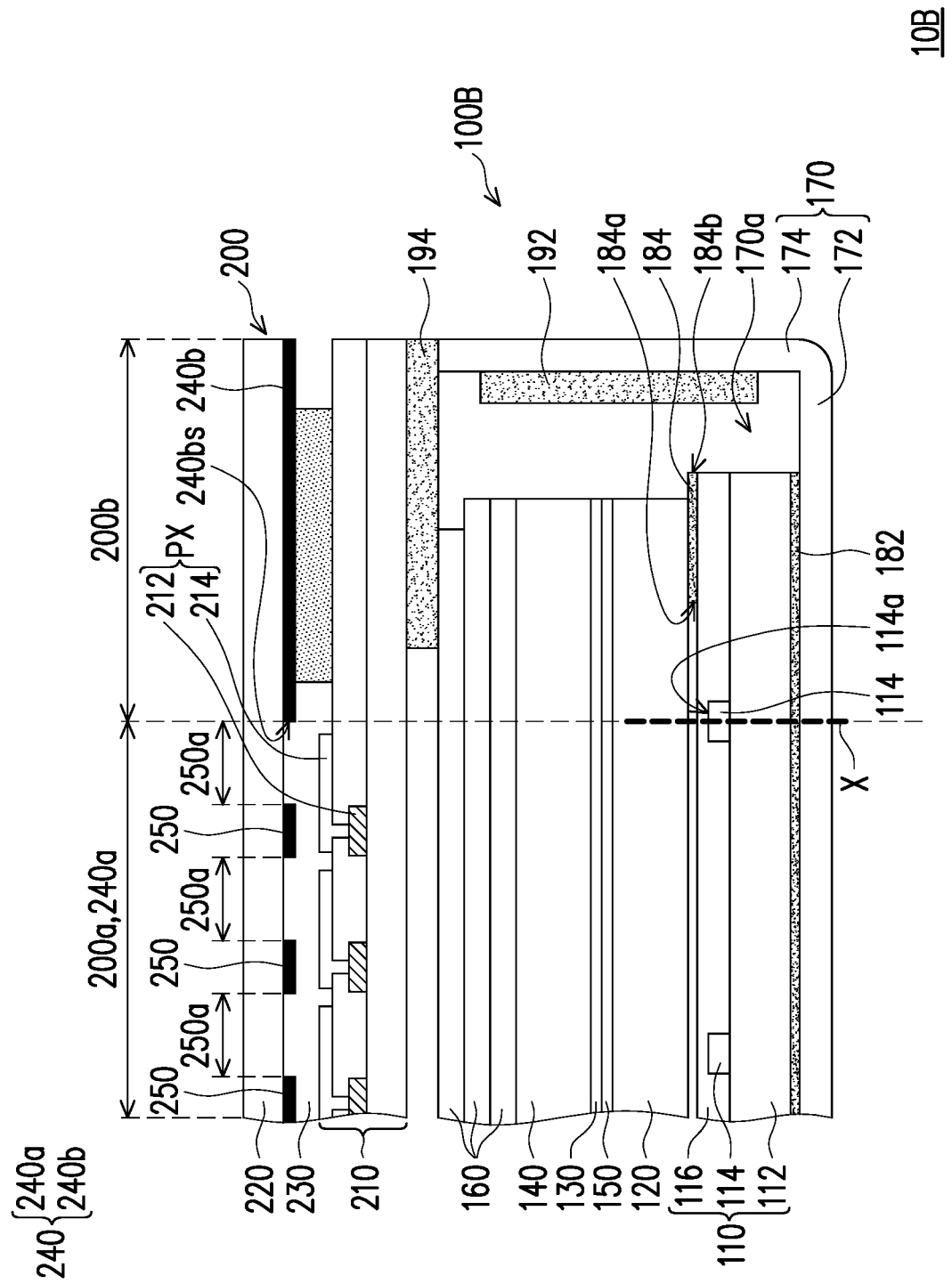
FIG. 3 is a schematic cross-sectional view of a display apparatus 10B according to still another embodiment of the invention.

FIG. 3 is a schematic cross-sectional view of a display apparatus 10B according to still another embodiment of the invention. The display apparatus 10B and a backlight module 100B thereof in FIG. 3 are similar to the display apparatus 10 and the backlight module 100 in FIG. 1, and a difference there between is that the display apparatus 10B and the backlight module 100B thereof in FIG. 3 do not include the plastic frame 190 of the display apparatus 10 and the backlight module 100 of FIG. 1, and the display apparatus 10B of FIG. 3 further includes a third adhesive layer 194 for connecting the display panel 200 and the backlight module 100 and a reflective device 192 disposed on the side wall 174 of the back plate 170. In the embodiment, the display panel 200 is directly adhered to the optical film 160 and/or a top surface of the side wall 174 of the back plate 170 through the third adhesive layer 194. The display device 10B and the backlight module 100B of the embodiment adopt a design without a plastic frame, so that a frame width of the display apparatus 10B may be narrower.

Figure 4:
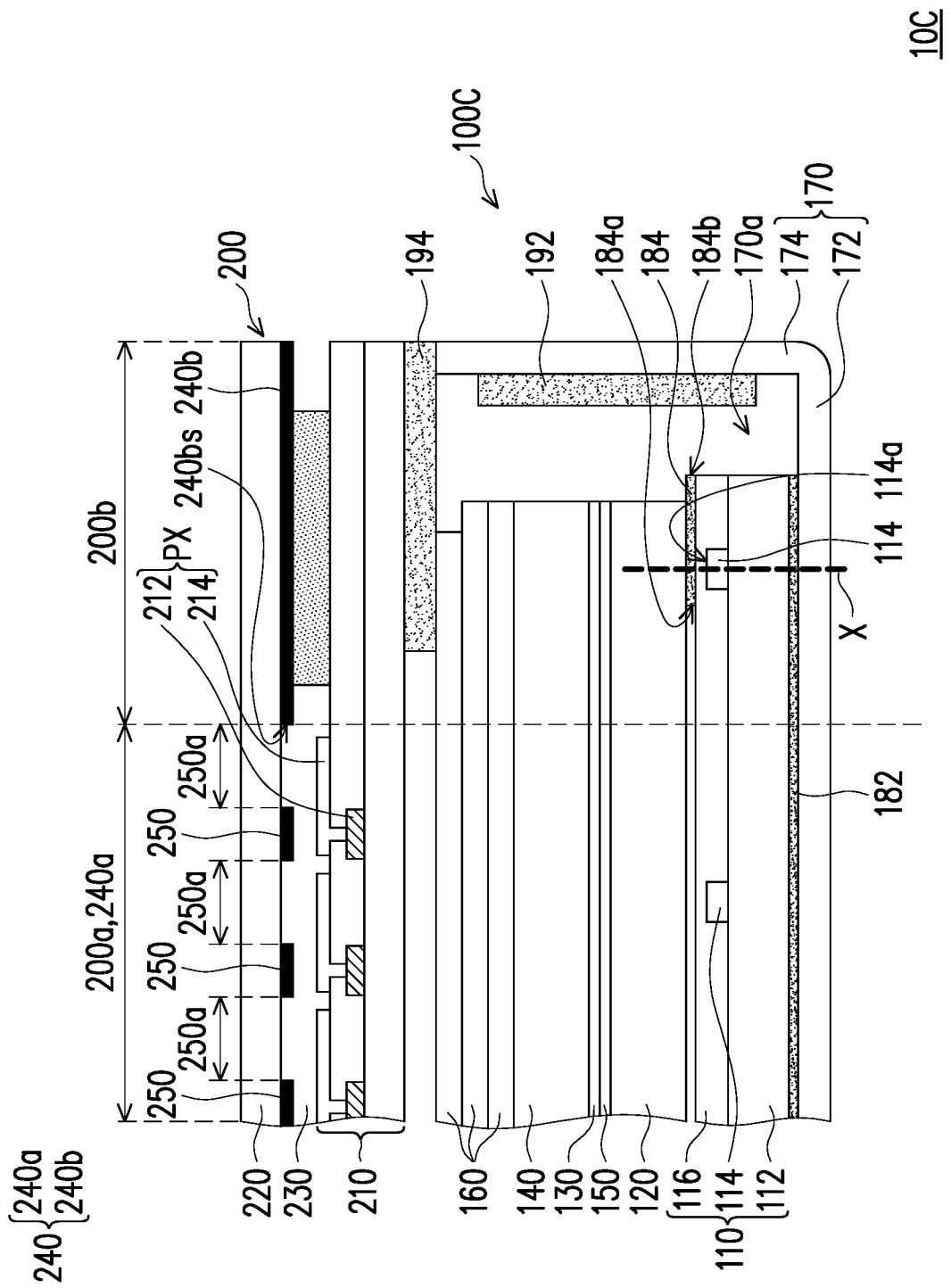
FIG. 4 is a schematic cross-sectional view of a display apparatus 10C according to yet another embodiment of the invention.

FIG. 4 is a schematic cross-sectional view of a display apparatus 10C according to yet another embodiment of the invention. The display apparatus 10C and a backlight module 100C thereof in FIG. 4 are similar to the display device 10B and the backlight module 100B in FIG. 3, and a difference there between is that a position of the at least one light-emitting device 114 of FIG. 4 is different from the position of the at least one light-emitting device 114 of FIG. 1.

Referring to FIG. 4, to be specific, in the embodiment, the optical axis X of the light-emitting surface 114a of at least one light-emitting device 114 is overlapped with the physical portion 240b of the peripheral light-shielding pattern 240. In other words, in the embodiment, at least one light-emitting device 114 is disposed in the non-active area 200b. Further, in the embodiment, at least one light-emitting device 114 may be overlapped with the physical portion 240b of the peripheral light-shielding pattern 240 and the glue 184.

Figure 5:
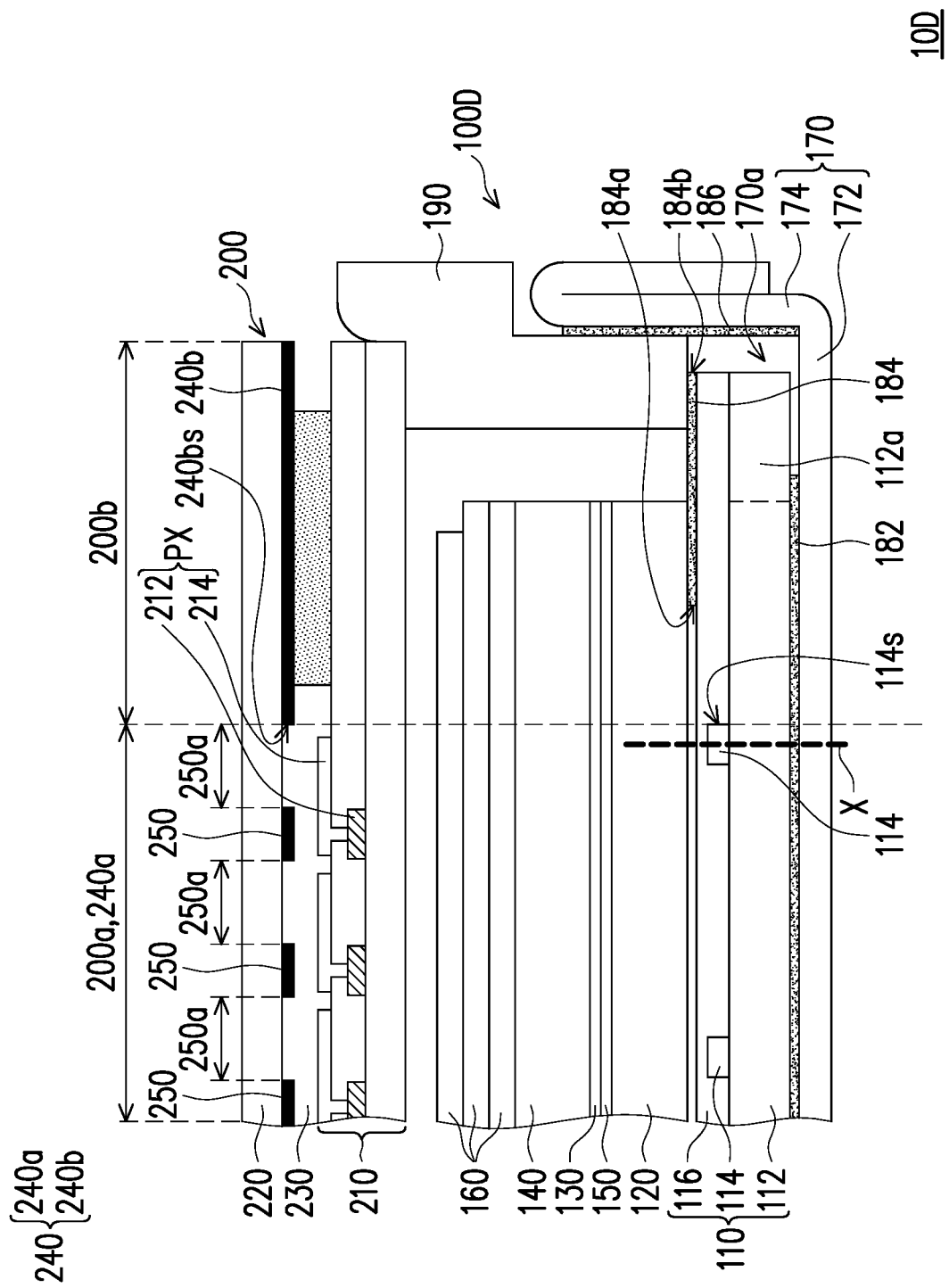
FIG. 5 is a schematic cross-sectional view of a display apparatus 10D according to an embodiment of the invention.

FIG. 5 is a schematic cross-sectional view of a display apparatus 10D according to an embodiment of the invention. The display apparatus 10D and a backlight module 100D thereof in FIG. 5 are similar to the display device 10 and the backlight module 100 in FIG. 1, and a difference there between is that a position of the at least one light-emitting device 114 of FIG. 5 is different from the position of the at least one light-emitting device 114 of FIG. 1. Referring to FIG. 5, to be specific, in the embodiment, the optical axis X of the light-emitting surface 114a of at least one light-emitting device 114 is located at the active area 200a and a side wall 114s of the at least one light-emitting device 114 is located at the junction of the active area 200a and the non-active area 200b.

In summary, the display apparatus of an embodiment of the invention includes the circuit board, the plurality of light-emitting devices disposed on the circuit board, and the display panel disposed on the plurality of light-emitting devices. The opening portion of the peripheral light-shielding pattern of the display panel defines the active area. The physical portion of the peripheral light-shielding pattern of the display panel defines the non-active area. The optical axis of the light-emitting surface of the at least one light-emitting element is located at the junction of the active area and the non-active area, at the non-active area, or at the active area and a side wall of the at least one of the light-emitting devices is located at the junction of the active area and the non-active area. Therefore, the illumination light beam emitted by the light-emitting device may be transmitted to the color conversion film disposed near the junction of the active area and the non-active area, thereby providing the white light required by the display panel near the junction of the active area and the non-active area, so as to mitigate the blue halo phenomenon on the edge of the display apparatus.

However, the foregoing is only a preferred embodiment of the invention, and should not be used to limit an implementation scope of the invention, namely, most simple equivalent changes and modifications made in accordance with the scope of the patent application of the invention and the description content of the invention are still within the scope of the invention. In addition, any embodiment of or the claims of the invention is unnecessary to implement all advantages or features disclosed by the invention. Moreover, the abstract and the name of the invention are only used to assist patent searching. Moreover, "first", "second", etc. mentioned in the specification and the claims are merely used to name the elements and should not be regarded as limiting the upper or lower bound of the number of the components/devices.

What is claimed is:

1. A display apparatus, comprising:
   a circuit board;
   a plurality of light-emitting devices, disposed on the circuit board, and electrically connected to the circuit board; and
   a display panel, disposed on the light-emitting devices, wherein the display panel comprises a peripheral light-shielding pattern, an opening portion of the peripheral light-shielding pattern defines an active area of the display panel, a physical portion of the peripheral light-shielding pattern defines a non-active area of the display panel;
   an optical axis of a light-emitting surface of at least one of the light-emitting devices is located at a junction of the active area and the non-active area, the optical axis of the light-emitting surface of the at least one of the light-emitting devices is located at the non-active area, or the optical axis of the light-emitting surface of the at least one of the light-emitting devices is located at the active area and a side wall of the at least one of the light-emitting devices is located at the junction of the active area and the non-active area.

2. The display apparatus as claimed in claim 1, wherein an inner edge of the physical portion of the peripheral light-shielding pattern defines the opening portion, and the optical axis of the light-emitting surface of at least one of the light-emitting devices is substantially aligned with the inner edge of the physical portion of the peripheral light-shielding pattern.

3. The display apparatus as claimed in claim 1, wherein the optical axis of the light-emitting surface of at least one of the light-emitting devices is overlapped with the physical portion of the peripheral light-shielding pattern.

4. The display apparatus as claimed in claim 1, further comprising:
   a first diffusion device, disposed on the light-emitting devices; and
   a glue, disposed between the first diffusion device and the circuit board, wherein the glue is overlapped with the physical portion of the peripheral light-shielding pattern and is misaligned with the opening portion of the peripheral light-shielding pattern, and the first diffusion device is fixed on the circuit board through the glue.

5. The display apparatus as claimed in claim 4, further comprising:
   a sealant layer, disposed on the circuit board and covering the light-emitting devices, wherein the sealant layer is disposed between the first diffusion device and the circuit board, and the glue is disposed on the sealant layer and disposed between the first diffusion device and the sealant layer.

6. The display apparatus as claimed in claim 4, further comprising:
   a plastic frame, wherein the first diffusion device is disposed in the plastic frame, the circuit board has a protruding portion extending beyond the first diffusion device, and the plastic frame is disposed on the protruding portion and fixed on the circuit board through the glue.

7. The display apparatus as claimed in claim 4, wherein at least a part of the at least one of the light-emitting devices is overlapped with the physical portion of the peripheral light-shielding pattern and is misaligned with the glue.

8. The display apparatus as claimed in claim 4, wherein the at least one of the light-emitting devices is overlapped with the physical portion of the peripheral light-shielding pattern and the glue.

9. The display apparatus as claimed in claim 4, wherein an inner edge of the glue is overlapped with an inside of the first diffusion device.

10. The display apparatus as claimed in claim 9, further comprising:
    a color conversion film, disposed on the first diffusion device, wherein the first diffusion device is disposed between the color conversion film and the circuit board, and the inner edge of the glue is overlapped with an inside of the color conversion film.

11. The display apparatus as claimed in claim 10, further comprising:
    a second diffusion device, disposed on the color conversion film, wherein the color conversion film is disposed between the first diffusion device and the second diffusion device, and the inner edge of the glue is overlapped with an inside of the second diffusion device.

12. The display apparatus as claimed in claim 11, further comprising:
    at least one optical film, disposed on the second diffusion device, wherein the at least one optical film is disposed between the display panel and the second diffusion device, and the inner edge of the glue is overlapped with an inside of the at least one optical film.

* * * * *